United States Patent
Huang

(10) Patent No.: US 12,080,642 B2
(45) Date of Patent: Sep. 3, 2024

(54) SEMICONDUCTOR DEVICE WITH CONDUCTIVE LAYERS HAVING DIFFERENT PATTERN DENSITIES AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 385 days.

(21) Appl. No.: 17/469,010

(22) Filed: Sep. 8, 2021

(65) Prior Publication Data

US 2023/0074752 A1 Mar. 9, 2023

(51) Int. Cl.
*H01L 23/528* (2006.01)
*H01L 21/033* (2006.01)
*H01L 21/311* (2006.01)
*H01L 21/3213* (2006.01)

(52) U.S. Cl.
CPC ........ *H01L 23/528* (2013.01); *H01L 21/0337* (2013.01); *H01L 21/31116* (2013.01); *H01L 21/32139* (2013.01)

(58) Field of Classification Search
CPC ............... H01L 23/528; H01L 21/0337; H01L 21/31116; H01L 21/32139
See application file for complete search history.

(56) References Cited

U.S. PATENT DOCUMENTS

| 7,714,378 | B2* | 5/2010 | Kim ................. H01L 21/76804 257/390 |
| 11,923,246 | B2* | 3/2024 | Motoyama ............ H01L 23/528 |
| 2010/0173492 | A1* | 7/2010 | Kim .................... H01L 21/0337 438/689 |
| 2012/0032267 | A1* | 2/2012 | Cheng ............... H01L 21/76237 257/E21.214 |
| 2016/0268257 | A1* | 9/2016 | Lim .................. H01L 29/66553 |
| 2017/0243944 | A1* | 8/2017 | Li ....................... H01L 29/7848 |
| 2019/0305111 | A1* | 10/2019 | Subramanian .... H01L 21/76895 |
| 2020/0135580 | A1 | 4/2020 | Taiwan |
| 2020/0176322 | A1* | 6/2020 | Lin .................... H01L 21/31116 |
| 2023/0062967 | A1* | 3/2023 | Huang ............. H01L 21/31116 |
| 2023/0197450 | A1* | 6/2023 | Ahn ....................... H10B 12/09 438/427 |

FOREIGN PATENT DOCUMENTS

| EP | 3268505 A1 | 1/2018 |
| TW | 411530 | 11/2000 |
| TW | 202030888 A | 8/2020 |

* cited by examiner

*Primary Examiner* — Eugene Lee
(74) *Attorney, Agent, or Firm* — MUNCY, GEISSLER, OLDS & LOWE, PC

(57) ABSTRACT

The present application discloses a semiconductor device and a method for fabricating the semiconductor device. The semiconductor device includes a substrate including a dense pattern area and a loose pattern area positioned adjacent to the dense pattern area; a plurality of dense conductive layers positioned on the dense pattern area of the substrate; and a plurality of loose conductive layers positioned on the loose pattern area of the substrate. A distance between an adjacent pair of the plurality of dense conductive layers is less than a distance between an adjacent pair of the plurality of loose conductive layers.

18 Claims, 14 Drawing Sheets

SEMICONDUCTOR DEVICE WITH CONDUCTIVE LAYERS HAVING DIFFERENT PATTERN DENSITIES AND METHOD FOR FABRICATING THE SAME

TECHNICAL FIELD

The present disclosure relates to a semiconductor device and a method for fabricating the semiconductor device, and more particularly, to a semiconductor device with conductive layers having different pattern densities and a method for fabricating the semiconductor device conductive layers having different pattern densities.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including a dense pattern area and a loose pattern area positioned adjacent to the dense pattern area; a plurality of dense conductive layers positioned on the dense pattern area of the substrate; and a plurality of loose conductive layers positioned on the loose pattern area of the substrate. A distance between an adjacent pair of the plurality of dense conductive layers is less than a distance between an adjacent pair of the plurality of loose conductive layers.

In some embodiments, an element density of the plurality of dense conductive layers is greater than an element density of the plurality of loose conductive layers.

Another aspect of the present disclosure provides a method for fabricating a semiconductor device including providing a substrate including a dense pattern area and a loose pattern area, and sequentially forming a conductive stack and a first hard mask layer on the dense pattern area and the loose pattern area; patterning the first hard mask layer to form a plurality of dense patterning layers above the dense pattern area; forming a second hard mask layer covering the first hard mask layer and the plurality of dense patterning layers; patterning the second hard mask layer to form a plurality of loose capping layers above the loose pattern area; patterning the first hard mask layer above the loose pattern area using the plurality of loose capping layers as masks to form a plurality of loose patterning layers above the loose pattern area, and removing the second hard mask layer and the plurality of loose capping layers; and patterning the conductive stack using the plurality of dense patterning layers and the plurality of loose patterning layers as masks to form a plurality of dense conductive layers above the dense pattern area and a plurality of loose conductive layers above the loose pattern area. A distance between an adjacent pair of the plurality of dense conductive layers is less than a distance between an adjacent pair of the plurality of loose conductive layers.

In some embodiments, the dense pattern area and the loose pattern area are adjacent to each other.

In some embodiments, an element density of the plurality of dense conductive layers is greater than an element density of the plurality of loose conductive layers.

In some embodiments, the first hard mask layer includes silicon nitride.

In some embodiments, patterning the first hard mask layer to form the plurality of dense patterning layers above the dense pattern area includes: forming a first mask layer on the first hard mask layer, wherein the first mask layer completely covers the loose pattern area and partially covers the dense pattern area; and performing a dense area etch process using the first mask layer as a mask to form the plurality of dense patterning layers above the dense pattern area.

In some embodiments, patterning the second hard mask layer to form the plurality of loose capping layers above the loose pattern area includes: forming a second mask layer on the second hard mask layer, wherein the second mask layer completely covers the dense pattern area and partially covers the loose pattern area; and performing a first loose area etch process using the second mask layer as a mask to form the plurality of loose capping layers above the loose pattern area.

In some embodiments, etching gases of the dense area etch process include boron trichloride and chlorine.

In some embodiments, etching gases of the first loose area etch process include boron trichloride and chlorine.

In some embodiments, a ratio of boron trichloride to chlorine of the dense area etch process is greater than a ratio of boron trichloride to chlorine of the first loose area etch process.

In some embodiments, a power ratio of the dense area etch process is less than a power ratio of the first loose area etch process.

In some embodiments, the second hard mask layer includes a material different from the first hard mask layer.

In some embodiments, the second hard mask layer includes a carbon film, a dielectric material, or an anti-reflection coating.

In some embodiments, the conductive stack includes a bottom conductive layer, a middle conductive layer, and a top conductive layer.

In some embodiments, the bottom conductive layer includes titanium.

In some embodiments, the middle conductive layer includes aluminum copper alloy.

In some embodiments, the top conductive layer includes a titanium/titanium nitride bilayer.

In some embodiments, chemical etchings are greater than physical etchings during the dense area etch process.

In some embodiments, chemical etchings are less than physical etchings during the first loose area etch process.

Due to the design of the semiconductor device of the present disclosure, the plurality of dense conductive layers and the plurality of loose conductive layers with different element densities may be easily integrated in the semiconductor device by employing the first hard mask layer and the second hard mask layer. Therefore, the complexity of fabricating the semiconductor device may be reduced. Accordingly, the yield of fabricating the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
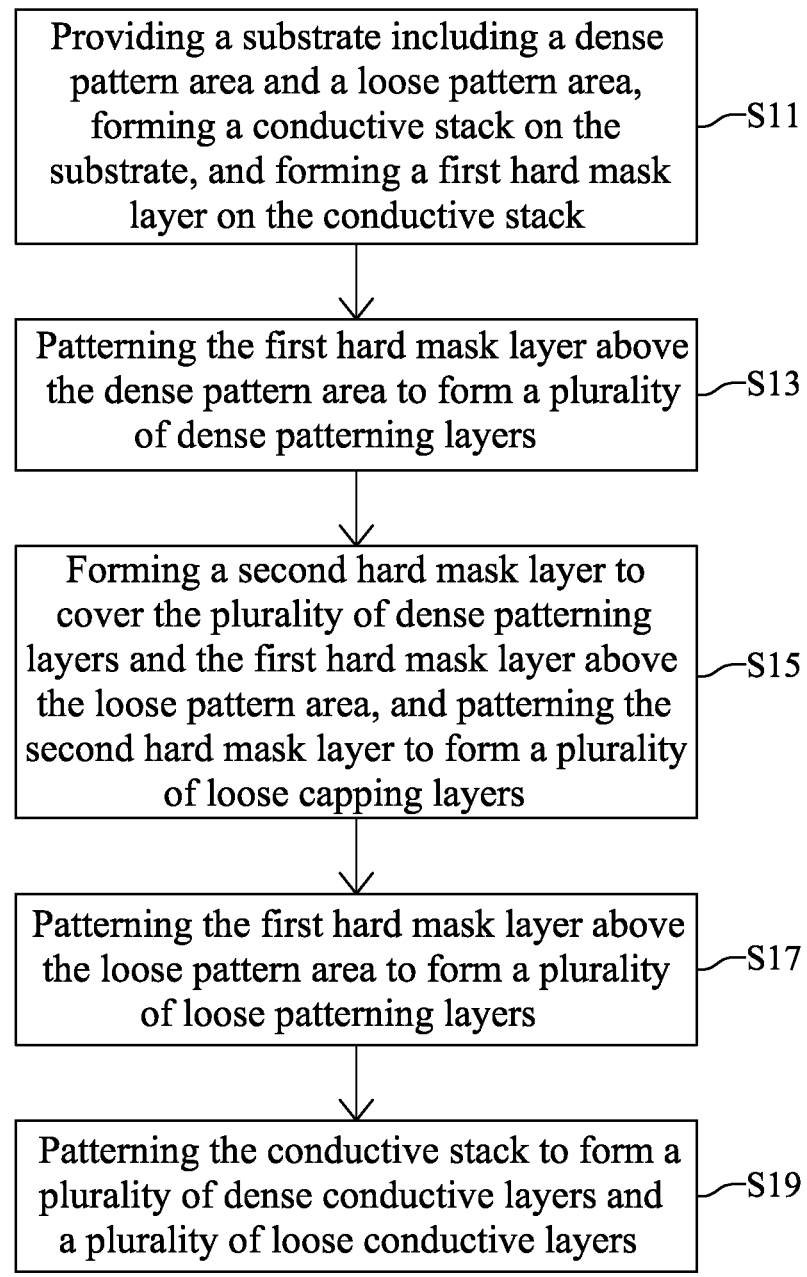
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

FIG. 1 illustrates, in a flowchart diagram form, a method 10 for fabricating a semiconductor device 1A in accordance with one embodiment of the present disclosure. FIGS. 2 to 13 illustrate, in schematic cross-sectional view diagrams, a flow for fabricating the semiconductor device 1A in accordance with one embodiment of the present disclosure.

Figure 2:
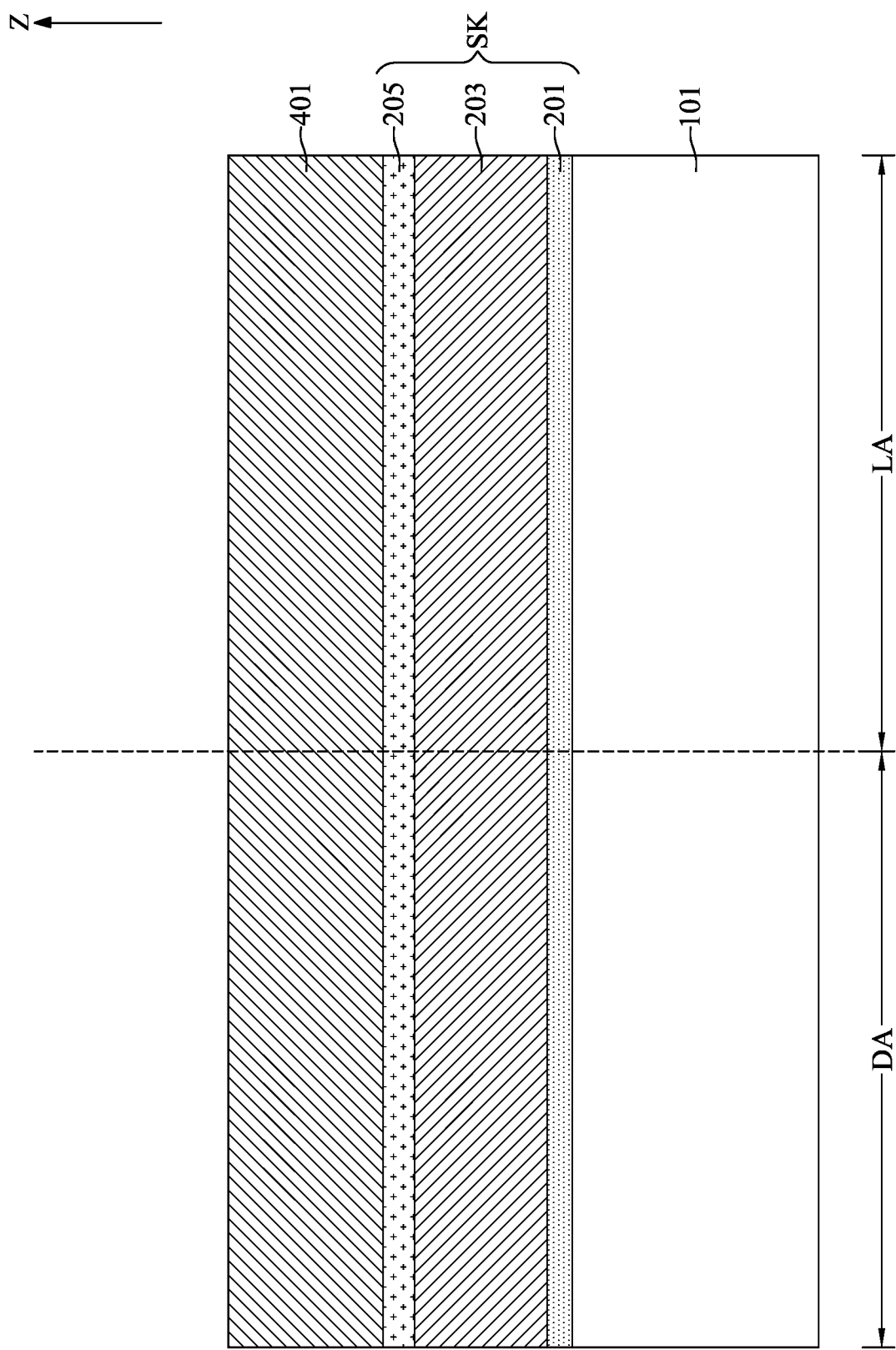
FIGS. 2 to 13 illustrate, in schematic cross-sectional view diagrams, a flow for fabricating the semiconductor device in accordance with one embodiment of the present disclosure.

With reference to FIGS. 1 and 2, at step S11, a substrate 101 may be provided and may include a dense pattern area DA and a loose pattern area LA, a conductive stack SK may be formed on the substrate 101, and a first hard mask layer 401 may be formed on the conductive stack SK.

With reference to FIG. 2, in some embodiments, the dense pattern area DA and the loose pattern area LA may be adjacent to each other. In some embodiments, the dense pattern area DA and the loose pattern area LA may be separated from each other. In some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the substrate 101 may include dielectrics, insulating layers, or conductive features (not shown for clarity) disposed on the bulk semiconductor substrate or the topmost semiconductor material layer. The dielectrics or the insulating layers may be formed of, for example, silicon oxide, borophosphosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, conductive pads, or the like. The conductive features may be formed of, for example, polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

In some embodiments, device elements (not shown for clarity) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation. The device elements may be electrically coupled to each other through the conductive features.

It should be noted that the dense pattern area DA may comprise a portion of the substrate 101 and a space above the portion of the substrate 101. Describing an element as being disposed on the dense pattern area DA means that the element is disposed on a top surface of the portion of the substrate 101. Describing an element as being disposed in the dense pattern area DA means that the element is disposed in the portion of the substrate 101; however, a top surface of the element may be even with the top surface of the portion of the substrate 101. Describing an element as being disposed above the dense pattern area DA means that the element is disposed above the top surface of the portion of the substrate 101. Accordingly, the loose pattern area LA may comprise another portion of the substrate 101 and a space above the other portion of the substrate 101.

With reference to FIG. 2, the conductive stack SK may be formed on the dense pattern area DA and the loose pattern area LA of the substrate 101. In some embodiments, the conductive stack SK may include a bottom conductive layer 201, a middle conductive layer 203, and a top conductive layer 205.

The bottom conductive layer 201 may be conformally formed on the dense pattern area DA and the loose pattern area LA of the substrate 101. In some embodiments, the bottom conductive layer 201 may be formed of, for example, titanium. The bottom conductive layer 201 may be formed by, for example, physical vapor deposition, atomic layer deposition, chemical vapor deposition, sputtering, or other applicable deposition process.

The middle conductive layer 203 may be formed on the bottom conductive layer 201 and above the dense pattern area DA and the loose pattern area LA of the substrate 101. In some embodiments, the middle conductive layer 203 may be formed of, for example, aluminum copper alloy. The middle conductive layer 203 may be formed by, for example, physical vapor deposition, chemical vapor deposition, sputtering, or other applicable deposition process.

The top conductive layer 205 may be formed on the middle conductive layer 203 and above the dense pattern area DA and the loose pattern area LA of the substrate 101. In some embodiments, the top conductive layer 205 may be formed of, for example, tantalum, tantalum nitride, titanium, titanium nitride, rhenium, nickel boride, titanium nitride/titanium bilayer, or tantalum nitride/tantalum bilayer. In some embodiments, the top conductive layer 205 may be formed of, for example, titanium nitride/titanium bilayer. The top conductive layer 205 may be formed by, for example, physical vapor deposition, atomic layer deposition, chemical vapor deposition, sputtering, or other applicable deposition process.

With reference to FIG. 2, the first hard mask layer 401 may be formed on the top conductive layer 205 and above the dense pattern area DA and the loose pattern area LA of the substrate 101. It should be noted that the first hard mask layer 401 may completely cover the conductive stack SK in the current stage. In some embodiments, the first hard mask layer 401 may have a thickness between about 80 nm and about 500 nm. In some embodiments, the thickness of the first hard mask layer 401 may be between about 100 nm and about 200 nm. In some embodiments, the first hard mask layer 401 may have a thickness between about 30 nm and about 50 nm. In some embodiments, the first hard mask layer 401 may be formed of, for example, silicon oxide, silicon nitride, silicon oxynitride, tetraethyl orthosilicate, or silicon nitride oxide. In some embodiments, the first hard mask layer 401 may be formed of silicon nitride. The first hard mask layer 401 may be formed by, for example, chemical vapor deposition, plasma-enhanced chemical vapor deposition, atomic layer deposition, the like, or other applicable deposition process. In some embodiments, the process temperature of forming the first hard mask layer 401 may be less than 400° C.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1 and FIGS. 3 to 5, at step S13, the first hard mask layer 401 above the dense pattern area DA may be patterned to form a plurality of dense patterning layers 401D.

Figure 3:
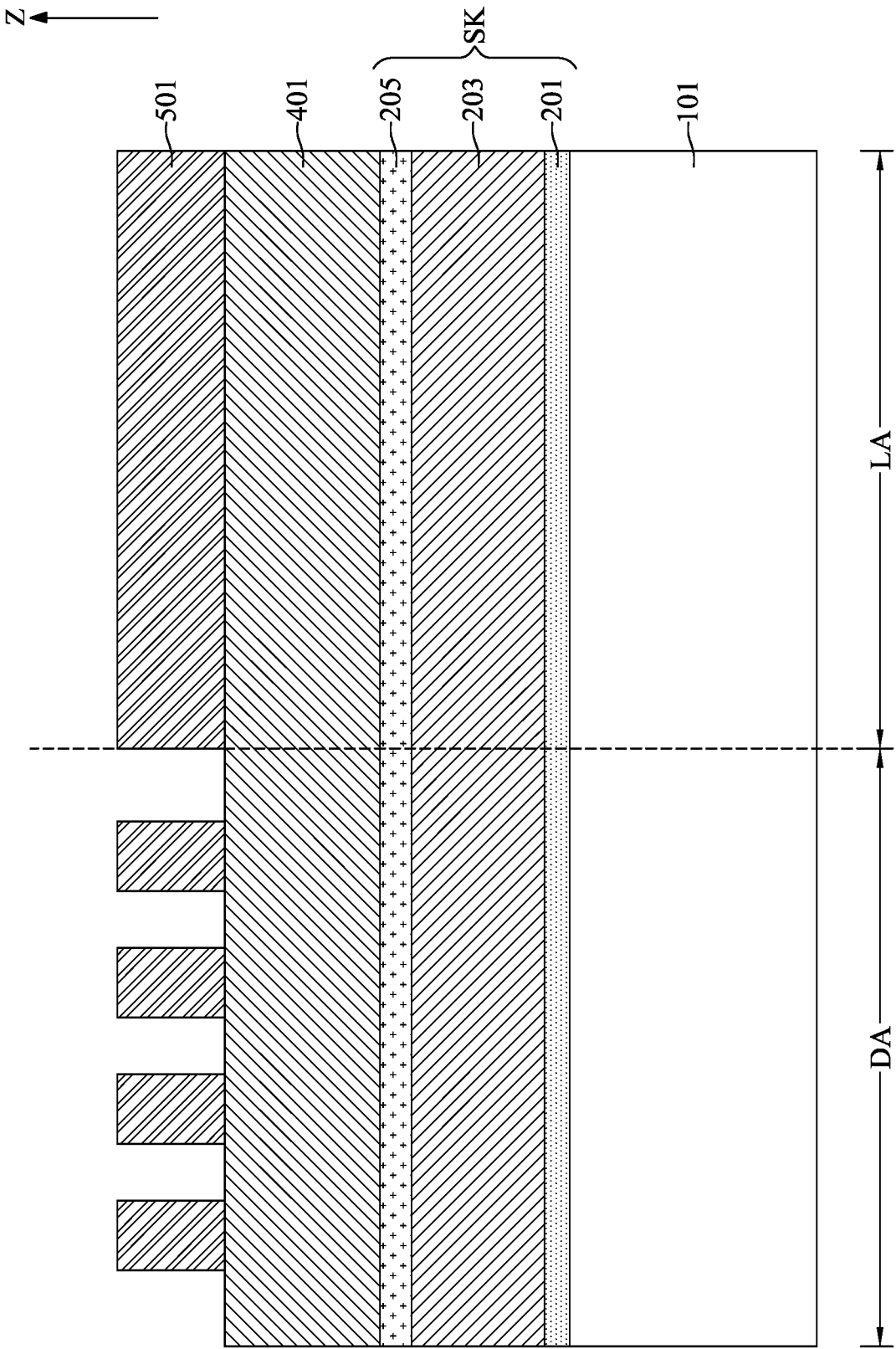

With reference to FIG. 3, a first mask layer 501 may be formed on the first hard mask layer 401. The first mask layer 501 may completely cover the first hard mask layer 401 above the loose pattern area LA and may partially cover the first hard mask layer 401 above the dense pattern area DA. In some embodiments, the first mask layer 501 may have the pattern of the plurality of dense patterning layers 401D. In some embodiments, the first mask layer 501 may be a photoresist layer.

Figure 4:
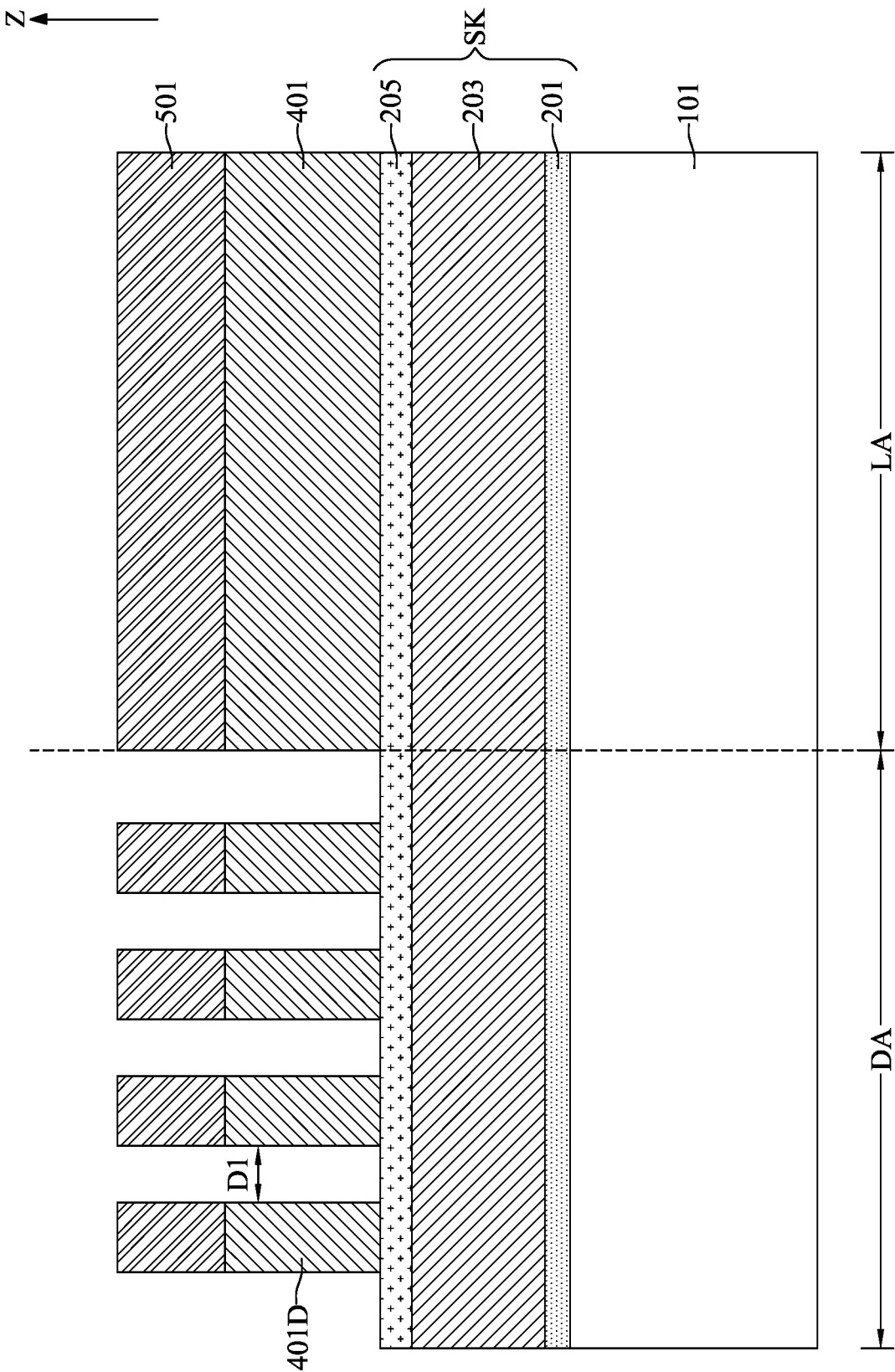

With reference to FIG. 4, a dense area etch process may be performed using the first mask layer 501 as a mask (or a pattern guide) to remove portions of the first hard mask layer 401 above the dense pattern area DA. After the dense area etch process, the remaining first hard mask layer 401 above the dense pattern area DA may be referred to as the plurality of dense patterning layers 401D. The top surface of the conductive stack SK (i.e., the top surface of the top conductive layer 205) may be partially exposed through spaces between adjacent pairs of the plurality of dense patterning layers 401D. A distance between an adjacent pair of the plurality of dense patterning layers 401D may be referred to as a distance D1.

In some embodiments, the dense area etch process may be performed at a cryogenic temperature. It should be noted that, in the present disclosure, the term "cryogenic" refers to "cold" substrate temperature. The term "cold" used in etching means −20° C. or lower. In some embodiments, the cryogenic temperature may be between about −20° C. and about −200° C. In some embodiments, the cryogenic temperature may be achieved by using a coolant. In some embodiments, the coolant may be, for example, liquid nitrogen or liquid Vertel Sinera™ (manufactured by DuPont Corporation).

In some embodiments, the etching gas of the dense area etch process may include boron trichloride and chlorine. Boron trichloride is not a traditional etchant since byproduct such as boron trioxide (B2O3) may block the etching process. It is believed that the blocking may be less at cryogenic temperatures and boron trichloride may work as an etchant component at cryogenic temperatures. In some embodiments, the etching gas of the dense area etch process may include nitrogen and fluoromethane. In some embodiments, the chemical etchings is greater than physical etchings during the dense area etch process.

It should be noted that, in the present disclosure, a chemical etching is the process by which a chemical chemisorbs onto a surface to spontaneously form a new species with the surface that will desorb at a thermal surface temperature. A physical etching is the process by which plasma bombards onto a surface to remove species of the surface.

In some embodiments, the excitation RF of the dense area etch process may be, for example, 400 kilohertz (kHz), 60 megahertz (MHz), and optionally, 2 MHz, or 27 MHz. The power of the excitation RF may be between about 200 watts and about 8000 watts. In some embodiments, the bias with a magnitude at least 400 volts may be provided during the dense area etch process. In some embodiments, the bias with a magnitude of at least 1000 volts would provide an improved etch. In some embodiments, the bias with a magnitude of at least 2000 volts would provide a further improved etch. In some embodiments, the plasma of the dense area etch process may be maintained between about 180 seconds and 3600 seconds. In some embodiments, the pressure of the dense area etch process may be between about 5 mTorr and about 60 mTorr.

In some embodiments, the etch rate ratio of the first mask layer 401 to the top conductive layer 205 may be between about 100:1 and about 1.05:1, between about 15:1 and about 2:1, or between about 10:1 and about 2:1 during the dense area etch process.

Figure 5:
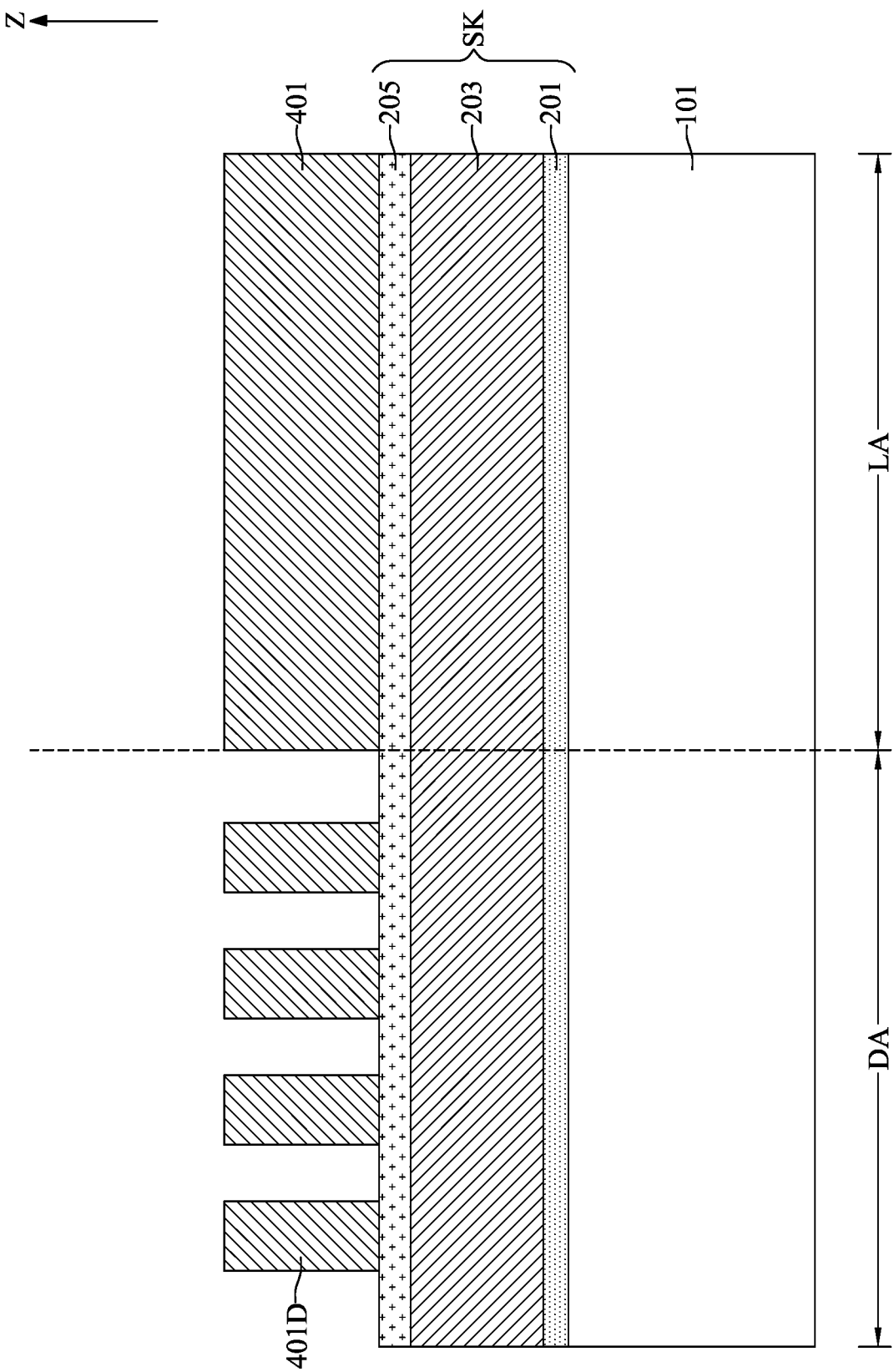

With reference to FIG. 5, after the formation of the plurality of dense patterning layers 401D, the first mask layer 501 may be removed with an ashing process or other applicable semiconductor process.

With reference to FIG. 1 and FIGS. 6 to 8, at step S15, a second hard mask layer 403 may be formed to cover the plurality of dense patterning layers 401D and the first hard mask layer 401 above the loose pattern area LA, and the second hard mask layer 403 may be patterned to form a plurality of loose capping layers 403L.

Figure 6:
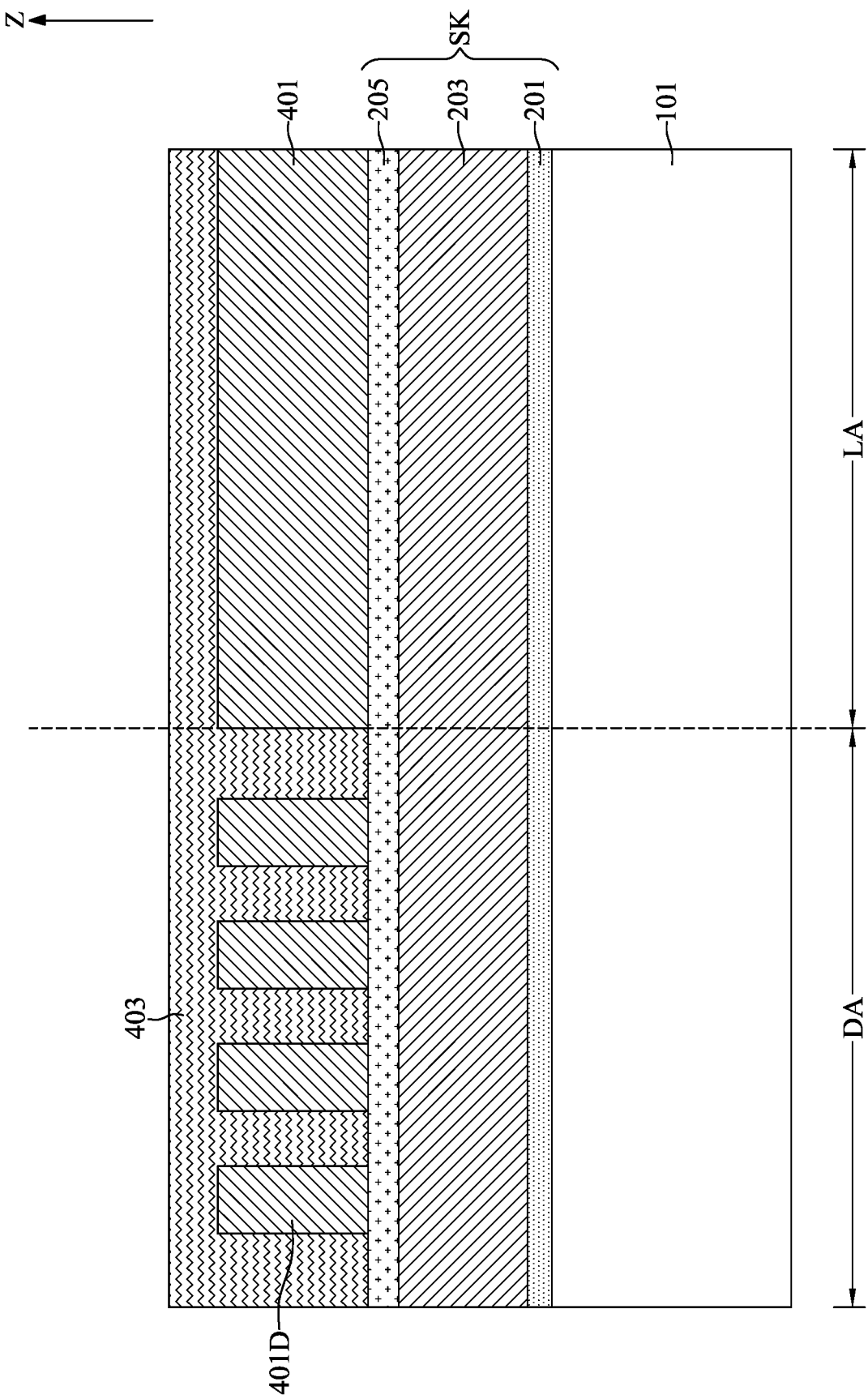

With reference to FIG. 6, in some embodiments, the second hard mask layer 403 may completely fill the spaces between the plurality of dense patterning layers 401D. In some embodiments, the second hard mask layer 403 may be partially fill the spaces between the plurality of dense patterning layers 401D. In some embodiments, a planarization process, such as chemical mechanical polishing, may be performed to remove provide a substantially flat surface for subsequent processing steps.

In some embodiments, the second hard mask layer 403 may be formed of a material having etch selectivity to the first hard mask layer 401. In some embodiments, the second hard mask layer 403 may be formed of, for example, a dielectric material other than silicon nitride, or an anti-reflection coating. In some embodiments, the second hard mask layer 403 may be formed of, for example, a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C., or between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer the desired pattern onto the underlying layers.

Alternatively, in some embodiments, the second hard mask layer 403 may be composed of carbon and hydrogen. In some embodiments, the second hard mask layer 403 may be composed of carbon, hydrogen, and oxygen. In some embodiments, the second hard mask layer 403 may be composed of carbon, hydrogen, and fluorine.

In some embodiments, the second hard mask layer 403 may be formed by a high-density plasma chemical vapor deposition process. The high-density plasma may be generated using inductively coupled RF power in a range between about 500 watts and about 4000 watts. In some embodiments, the high-density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm. The process pressure of the high-density plasma chemical vapor deposition process may be about 5 millitorr and about 20 millitorr. The process temperature of the high-density plasma chemical vapor deposition process may be between about 240° C. and about 340° C.

In some embodiments, the second hard mask layer 403 may be formed with fluorine doping by adding a source of fluorine during the high-density plasma chemical vapor deposition process. The source of fluorine may be, for example, octafluorocyclobutane, tetrafluoromethane, hexafluoroethane, octafluoropropane, trifluoromethane, hexafluorobenzene, or a combination thereof. The flow rate of the source of fluorine may be between slightly greater 0 and about 150 sccm. The flow rate ratio of the source of fluorine to the source of carbon is important for the doping level and the thermal stability of the second hard mask layer 403. For an unbiased process situation, the flow rate ratio of the source of fluorine to the source of carbon may be between about 0.2 and about 2. For a biased process situation, the flow rate ratio of the source of fluorine to the source of carbon may be between about 0.7 and about 1.3.

In some embodiments, an annealing process may be performed after the high-density plasma chemical vapor deposition process to enhance the thermal stability of the second hard mask layer 403. The annealing process may be carried out in vacuum, or in an inert atmosphere composed of gasses such as argon or nitrogen, at a temperature between about 300° C. and about 450° C. for approximately 30 minutes.

The thickness and uniformity of the second hard mask layer 403 formed by the high-density plasma chemical vapor deposition process may be well controlled. For example, the standard deviation of the thickness of the second hard mask layer 403 may be less than 4%. In addition, the second hard mask layer 403 formed by the high-density plasma chemical vapor deposition process may be thermally stable at elevated temperatures up to approximately 400° C. Thermal stability means that the second hard mask layer 403 will not suffer from weight loss, deformation or chemical reactions when exposed to etch environments at temperatures between about 200° C. and about 400° C. The thermal stability of the second hard mask layer 403 at elevated temperatures, will allow for its use as a mask for etch operations that are performed at temperatures higher than 200° C. Furthermore, the etch resistance property of the second hard mask layer 403 may be tuned by adjusting the doping level of fluorine. The etch resistive property of the second hard mask layer 403 may be decreased with higher doping level of fluorine.

Figure 7:
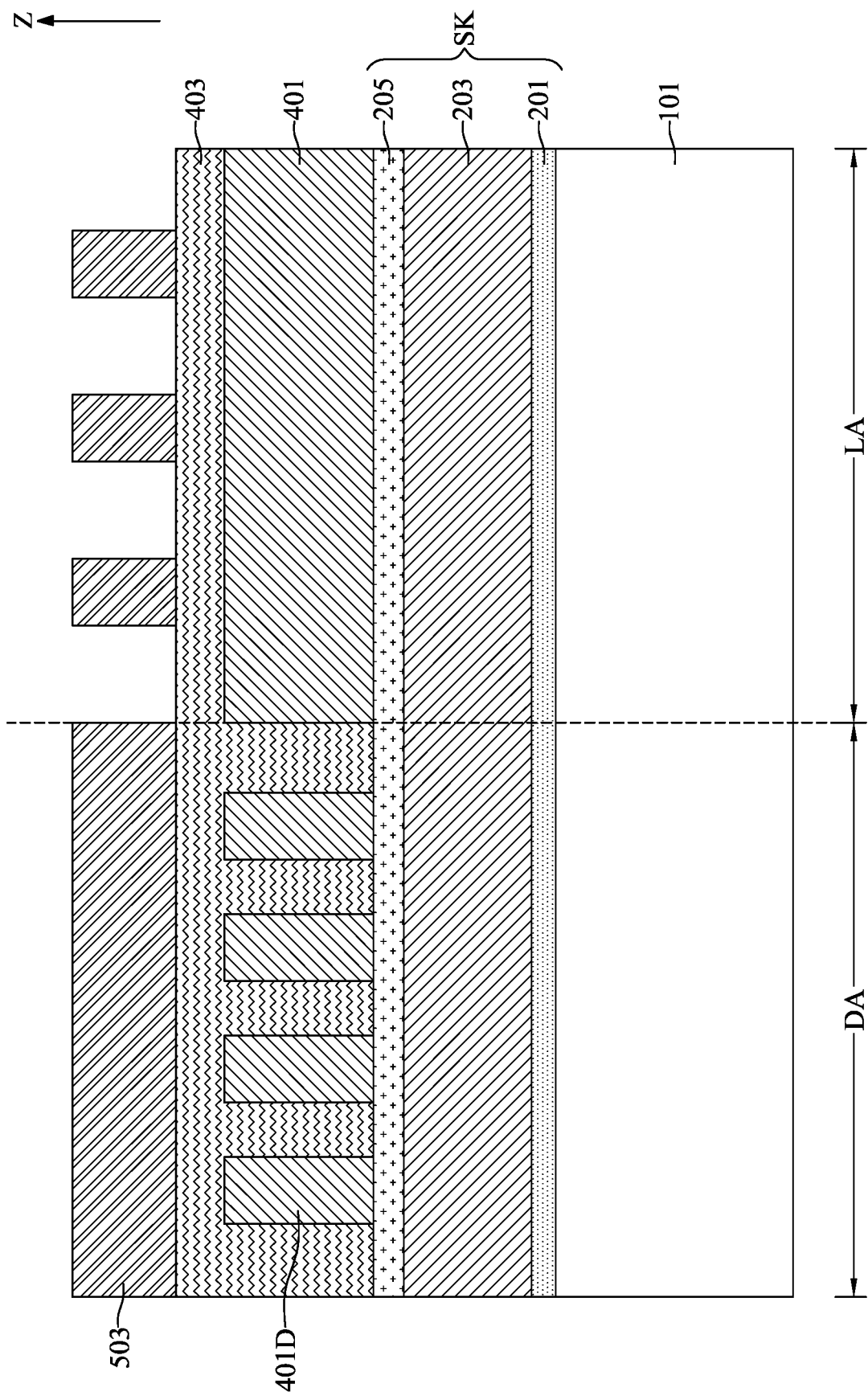

With reference to FIG. 7, a second mask layer 503 may be formed on the second hard mask layer 403. The second mask layer 503 may completely cover the second hard mask layer 403 above the dense pattern area DA and may partially cover the second hard mask layer 403 above the loose pattern area LA. In some embodiments, the second mask layer 503 may have the pattern of the plurality of loose capping layers 403L. In some embodiments, the second mask layer 503 may be a photoresist layer.

Figure 8:
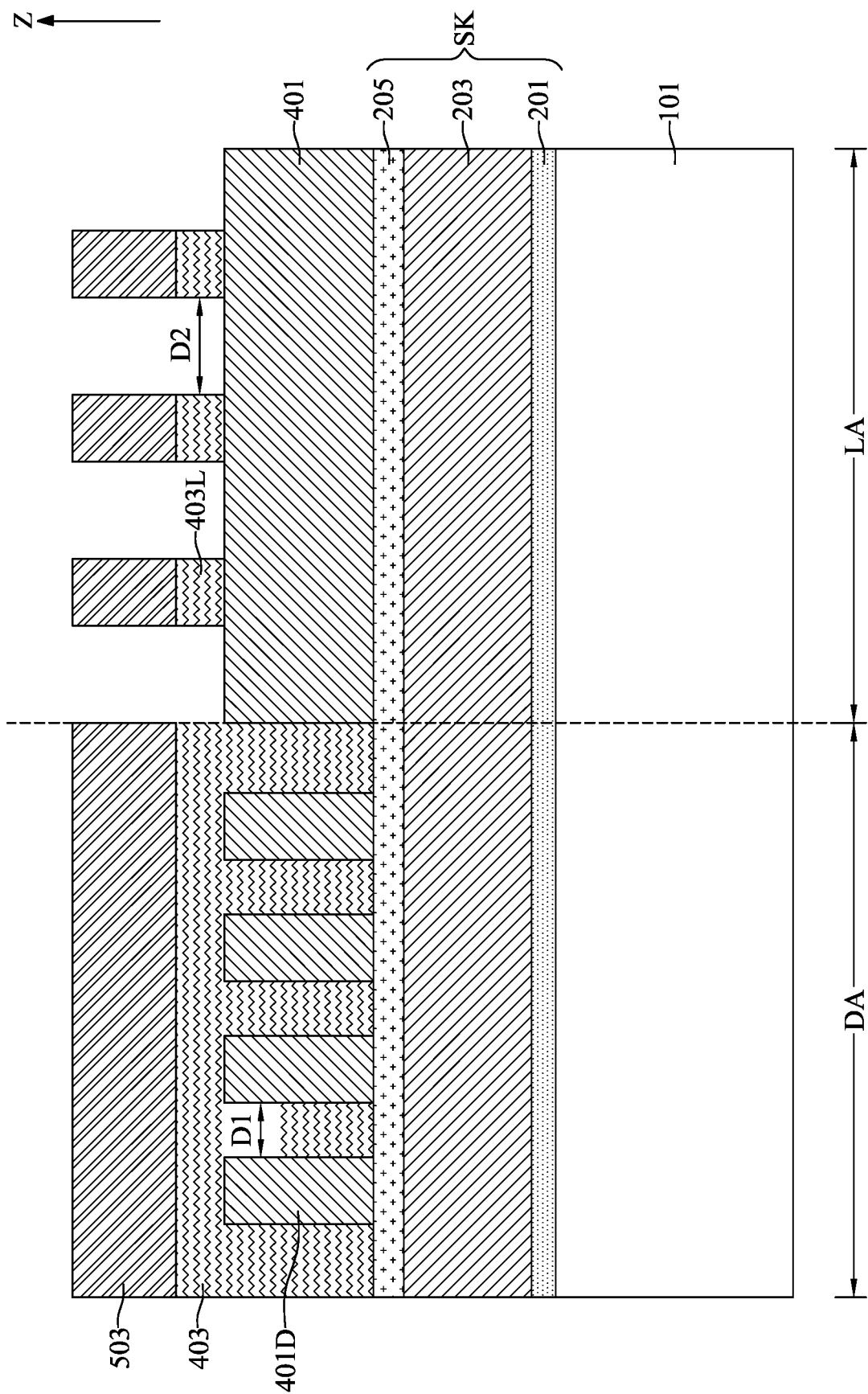

With reference to FIG. 8, a first loose area etch process may be performed using the second mask layer 503 as a mask (or a pattern guide) to remove portions of the second hard mask layer 403 above the loose pattern area LA. After the first loose area etch process, the remaining second hard mask layer 403 above the loose pattern area LA may be referred to as the plurality of loose capping layers 403L. The top surface of the first hard mask layer 401 above the loose pattern area LA may be partially exposed through spaces between adjacent pairs of the plurality of loose capping layers 403L. A distance between an adjacent pair of the plurality of loose capping layers 403L may be referred to as a distance D2. The distance D2 between the adjacent pair of the plurality of loose capping layers 403L may be greater than the distance D1 between the adjacent pair of the plurality of dense patterning layers 401D.

In some embodiments, the first loose area etch process may be performed at a cryogenic temperature. In some embodiments, the cryogenic temperature may be between about −20° C. and about −200° C. In some embodiments, the cryogenic temperature may be achieved by using a coolant. In some embodiments, the coolant may be, for example, liquid nitrogen or liquid Vertel Sinera™ (manufactured by DuPont Corporation). In some embodiments, the etching gas of the first loose area etch process may include boron trichloride and chlorine. In some embodiments, the etching gas of the first loose area etch process may include fluoromethane, carbon tetrachloride, trifluoroiodomethane, dibromodiflyoromethane, or pentafluoroethane. These chemistries could be in combination with each other or with the addition of one or more of hydrogen, oxygen, water, and hydrogen peroxide. In some embodiments, the first loose area etch process may include other passivation components such as chromyl chloride, silicon tetrachloride, thionyl chloride, dichlorotitanium, trichlorotitanium, and phosgene. In some embodiments, the chemical etchings is less than physical etchings during the first loose area etch process.

In some embodiments, the excitation RF of the first loose area etch process may be, for example, 400 kHz, 60 MHz, and optionally, 2 MHz, or 27 MHz. The power of the excitation RF may be between about 200 watts and about 8000 watts. In some embodiments, the bias with a magnitude at least 400 volts may be provided during the first loose area etch process. In some embodiments, the bias with a magnitude of at least 1000 volts would provide an improved etch. In some embodiments, the bias with a magnitude of at least 2000 volts would provide a further improved etch. In some embodiments, the plasma of the first loose area etch process may be maintained between about 180 seconds and 3600 seconds. In some embodiments, the pressure of the first loose area etch process may be between about 5 mTorr and about 60 mTorr.

In some embodiments, the etch rate ratio of the second hard mask layer 403 to the first hard mask layer 401 may be between about 100:1 and about 1.05:1, between about 15:1 and about 2:1, or between about 10:1 and about 2:1 during the first loose area etch process.

In some embodiments, a ratio of boron trichloride to chlorine of the dense area etch process is greater than a ratio of boron trichloride to chlorine of the first loose area etch process. In some embodiments, the power ratio of the dense area etch process is less than a power ratio of the first loose area etch process. The power ratio may be defined by the power of the excitation RF divided by the power of the bias of the dense area etch process and the first loose area etch process, respectively.

Figure 9:
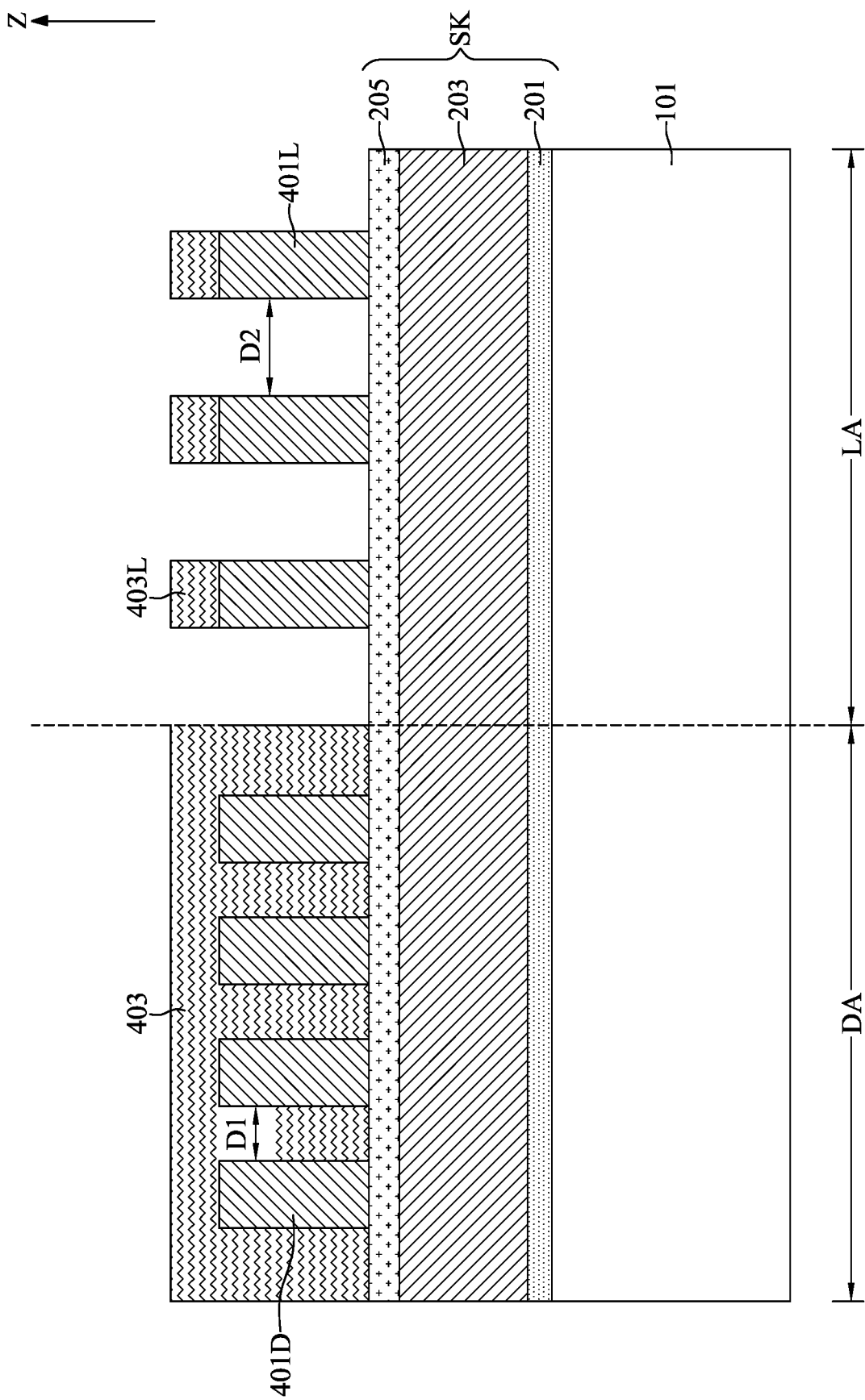
Figure 10:
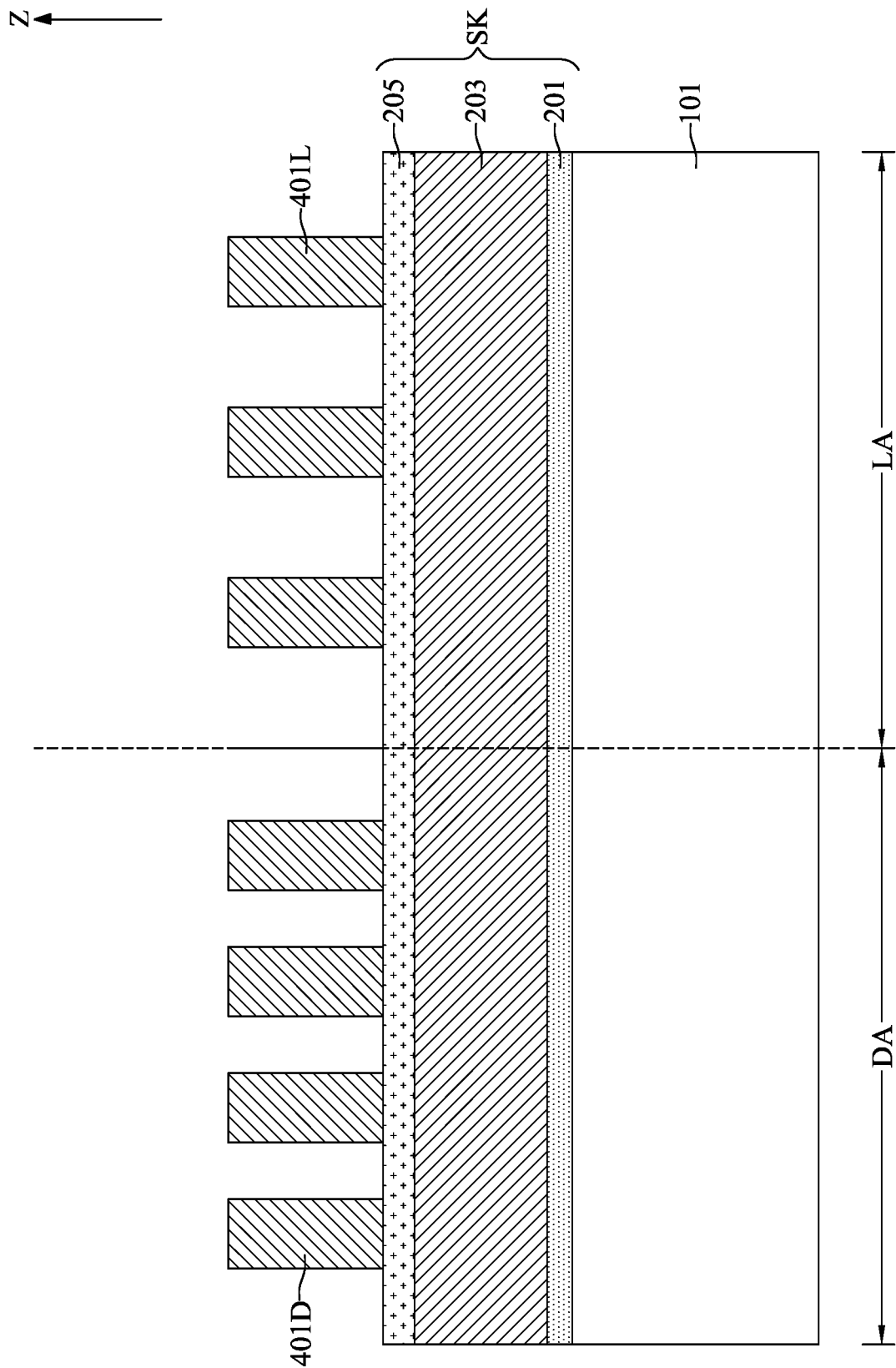

With reference to FIGS. 1, 9 and 10, at step S17, the first hard mask layer 401 above the loose pattern area LA may be patterned to form a plurality of loose patterning layers 401L.

With reference to FIG. 9, the second mask layer 503 may be removed by an ashing process or other applicable semiconductor process. In some embodiments, the second mask layer 503 may be removed after the formation of the plurality of loose patterning layers 401L.

With reference to FIG. 9, a second loose area etch process may be performed using the plurality of loose capping layers 403L as masks (or pattern guides) to remove portions of the first hard mask layer 401 above the loose pattern area LA. After the second loose area etch process, the remaining first hard mask layer 401 above the loose pattern area LA may be referred to as the plurality of loose patterning layers 401L. The top surface of the conductive stack SK above the loose pattern area LA may be partially exposed through spaces between adjacent pairs of the plurality of loose patterning layers 401L. Due to the pattern of the loose patterning layer 401L is transferred from the pattern of the plurality of loose capping layers 403L, the distance between an adjacent pair of the plurality of loose patterning layers 401L may be also referred to as the distance D2. The distance D2 between the adjacent pair of the plurality of loose patterning layers 401L may be greater than the distance D1 between the adjacent pair of the plurality of dense patterning layers 401D.

In some embodiments, the second loose area etch process may be performed at a cryogenic temperature. In some embodiments, the cryogenic temperature may be between about −20° C. and about −200° C. In some embodiments, the cryogenic temperature may be achieved by using a coolant. In some embodiments, the coolant may be, for example, liquid nitrogen or liquid Vertel Sinera™ (manufactured by DuPont Corporation). In some embodiments, the etching gas of the second loose area etch process may include boron trichloride and chlorine. In some embodiments, the etching gas of the second loose area etch process may include fluoromethane, carbon tetrachloride, trifluoroiodomethane, dibromodiflyoromethane, or pentafluoroethane. These chemistries could be in combination with each other or with the addition of one or more of hydrogen, oxygen, water, and hydrogen peroxide. In some embodiments, the second loose area etch process may include other passivation components such as chromyl chloride, silicon tetrachloride, thionyl chloride, dichlorotitanium, trichlorotitanium, and phosgene. In some embodiments, the chemical etchings is less than physical etchings during the second loose area etch process.

In some embodiments, the excitation RF of the second loose area etch process may be, for example, 400 kHz, 60 MHz, and optionally. 2 MHz, or 27 MHz. The power of the excitation RF may be between about 200 watts and about 8000 watts. In some embodiments, the bias with a magnitude at least 400 volts may be provided during the second loose area etch process. In some embodiments, the bias with a magnitude of at least 1000 volts would provide an improved etch. In some embodiments, the bias with a magnitude of at least 2000 volts would provide a further improved etch. In some embodiments, the plasma of the second loose area etch process may be maintained between about 180 seconds and 3600 seconds. In some embodiments, the pressure of the second loose area etch process may be between about 5 mTorr and about 60 mTorr.

In some embodiments, the etch rate ratio of the first hard mask layer 401 to the second hard mask layer 403 may be between about 100:1 and about 1.05:1, between about 15:1 and about 2:1, or between about 10:1 and about 2:1 during the second loose area etch process. In some embodiments, the etch rate ratio of the first hard mask layer 401 to the top conductive layer 205 may be between about 100:1 and about 1.05:1, between about 15:1 and about 2:1, or between about 10:1 and about 2:1 during the second loose area etch process.

In some embodiments, a ratio of boron trichloride to chlorine of the dense area etch process is greater than a ratio of boron trichloride to chlorine of the second loose area etch process. In some embodiments, the power ratio of the dense area etch process is less than a power ratio of the second loose area etch process. The power ratio may be defined by the power of the excitation RF divided by the power of the bias of the dense area etch process and the second loose area etch process, respectively.

With reference to FIG. 10, after the formation of the plurality of loose patterning layers 401L, the second hard mask layer 403 may be completely removed. For example, the second hard mask layer 403 may be removed with a procedure similar to the first loose area etch process described in FIG. 8. The conductive stack SK above the dense pattern area DA and the loose pattern area LA may be partially exposed through spaces between the adjacent pairs of the plurality of dense patterning layers 401D, between the adjacent pairs of the plurality of loose patterning layers 401L, and between an adjacent pair between the dense patterning layer 401D and the loose patterning layer 401L.

In some embodiments, the plurality of dense patterning layers 401D may have an element density (or pattern density) greater than that of the plurality of loose patterning layers 401L. The element density may be a value defined by the elements (e.g., the dense patterning layers 401D or loose patterning layers 401L) formed above the dense pattern area DA (or the loose pattern area LA) divided by the surface area of the dense pattern area DA (or the loose pattern area LA from a top-view perspective). From a cross-sectional perspective, a greater element density may mean a smaller distance between an adjacent pair of elements. In other words, the element density of the elements may be inversely proportional to the critical dimension of the elements. As shown in FIG. 10, more dense patterning layers 401D are shown to emphasize that the plurality of dense patterning layers 401D has a greater element density than that of the plurality of loose patterning layers 401L. It should be noted that, numbers of the dense patterning layer 401D or the loose patterning layer 401L shown in FIG. 10 are illustrative only.

With reference to FIG. 1 and FIGS. 11 to 13, at step S19, the conductive stack SK may be patterned to form a plurality of dense conductive layers 301 and a plurality of loose conductive layers 303.

Figure 11:
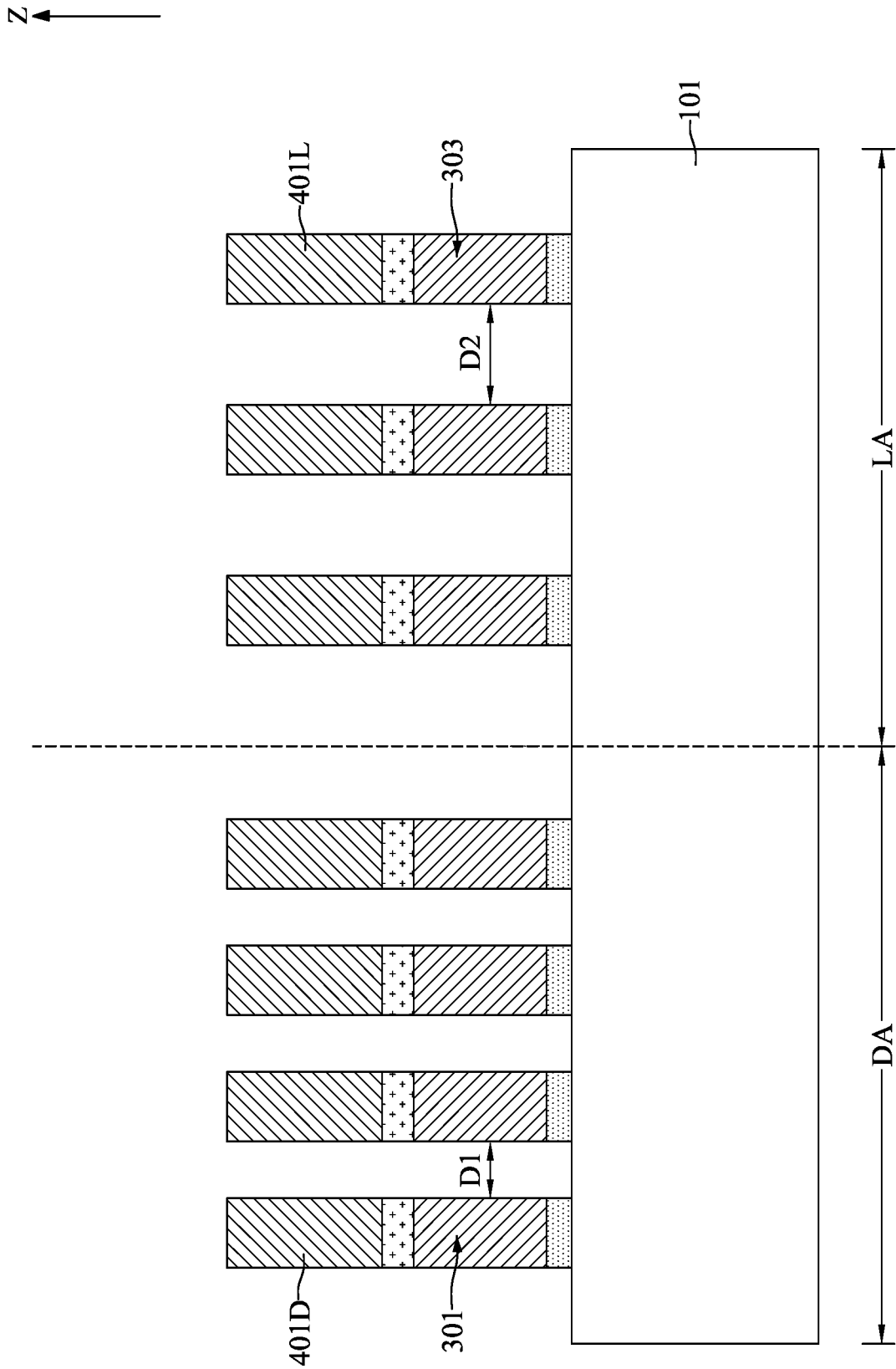

With reference to FIG. 11, a stack etch process may be performed using the plurality of dense patterning layers 401D and the plurality of loose patterning layers 401L as masks (or pattern guides) to remove portions of the conductive stack SK. After the stack etch process, the remaining conductive stack SK on the dense pattern area DA may be referred to as the plurality of dense conductive layers 301 and the remaining conductive stack SK on the loose pattern area LA may be referred to as the plurality of loose conductive layers 303. Each or the plurality of dense conductive layers 301 and each of the plurality of loose conductive layers 303 may be consisted of, from bottom to top, the (remaining) bottom conductive layer 201, the (remaining) middle conductive layer 203, and the (remaining) top conductive layer 205.

Due to the patterns of the plurality of dense conductive layers 301 and the plurality of loose conductive layers 303 are inherited from the plurality of dense patterning layers 401D and the plurality of loose patterning layers 401L, respectively and correspondingly. A distance between an adjacent pair of the plurality of dense conductive layers 301 may be also referred to as the distance D1. A distance between an adjacent pair of the plurality of loose conductive layers 303 may be also referred to as the distance D2. The distance D2 between the adjacent pair of the plurality of loose conductive layers 303 may be greater than the distance D1 between the adjacent pair of the plurality of dense conductive layers 301. Accordingly, the element density of the plurality of dense conductive layers 301 may be greater than the element density of the plurality of loose conductive layers 303.

In some embodiments, the stack etch process may be a multiple step etch process. In some embodiments, the etch rate ratio of the conductive stack SK to the plurality of dense patterning layers 401D may be between about 100:1 and about 1.05:1, between about 15:1 and about 2:1, or between about 10:1 and about 2:1 during the stack etch process. In some embodiments, the etch rate ratio of the conductive stack SK to the substrate 101 may be between about 100:1 and about 1.05:1, between about 15:1 and about 2:1, or between about 10:1 and about 2:1 during the stack etch process.

Figure 12:
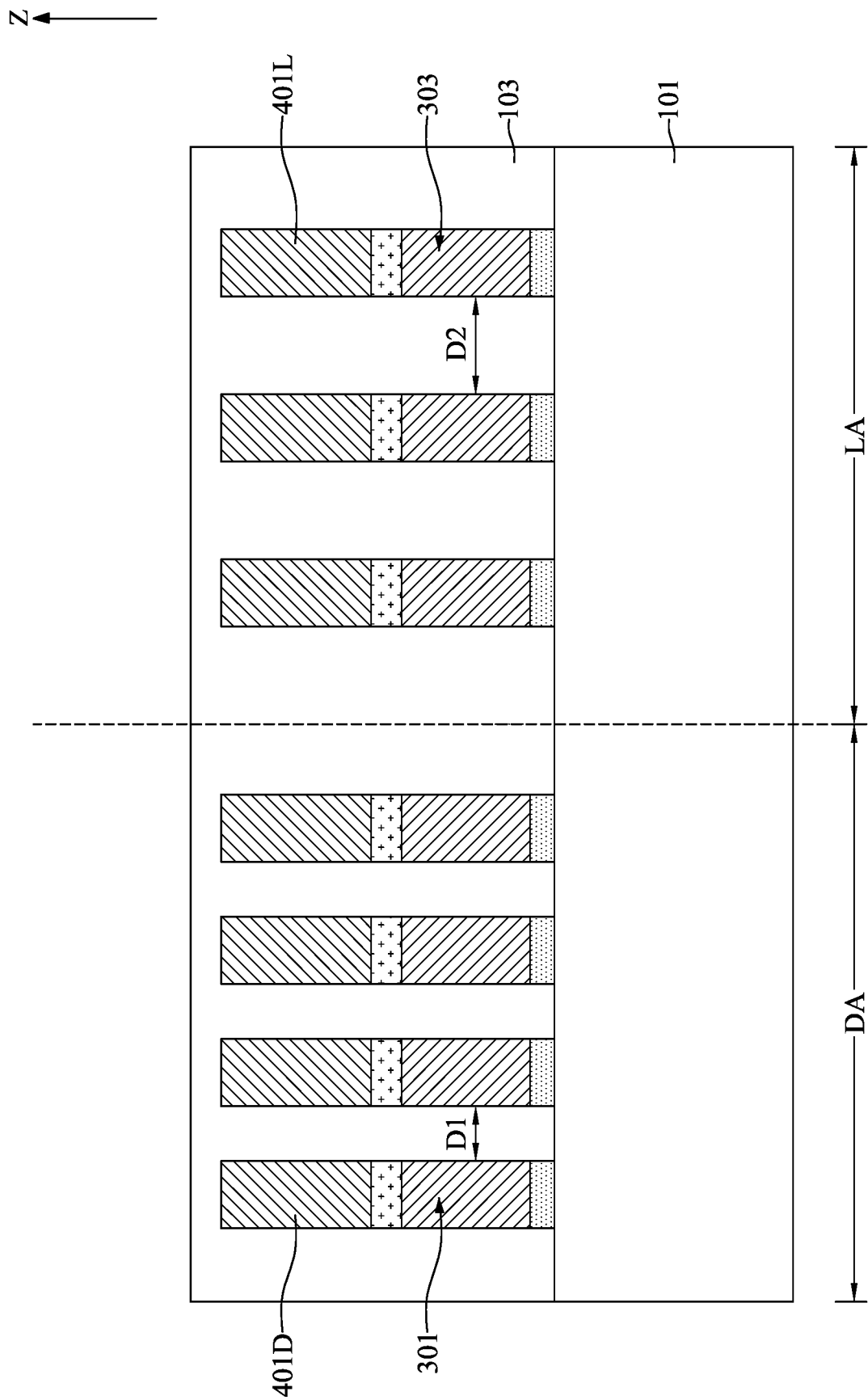

With reference to FIG. 12, a top dielectric layer 103 may be formed to cover the plurality of dense conductive layers 301 and the plurality of loose conductive layers 303, and completely fill the spaces between thereof. The top dielectric layer 103 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The top dielectric layer 103 may be formed by, for example, chemical vapor deposition, plasma-enhanced chemical vapor deposition, the like, or other applicable deposition process. A planarization process, such as chemical mechanical polishing, may be performed to provide a substantially flat surface for subsequent processing steps. Alternatively, in some embodiments, the planarization process illustrated in FIG. 12 may be directly performed until the top surfaces of the plurality of dense conductive layers 301 and the plurality of loose conductive layers 303 are exposed to form the semiconductor device 1A. As a result, the process complexity of fabricating the semiconductor device 1A may be reduced.

Figure 13:
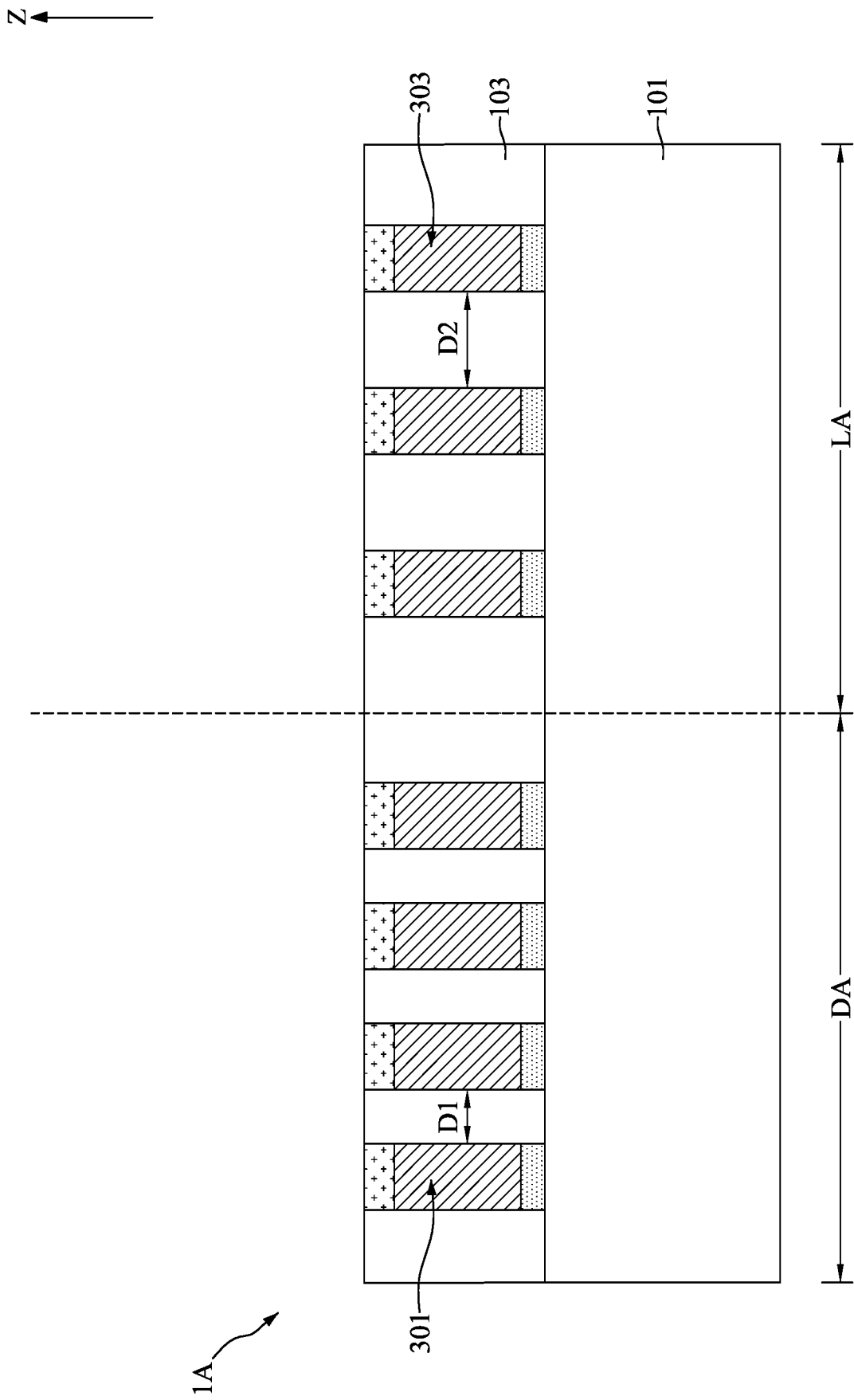

With reference to FIG. 13, a planarization process, such as chemical mechanical polishing, may be performed until the top surfaces of the plurality of dense conductive layers 301 and the plurality of loose conductive layers 303 are exposed to remove excess material, provide a substantially flat surface for subsequent processing steps, and concurrently form the semiconductor device 1A. Separated planarization processes may be beneficial for controlling process parameters and end point detection so that the yield and/or quality of the semiconductor device 1A may be improved. In addition, the cost of fabricating the semiconductor device 1A may be decreased.

Figure 14:
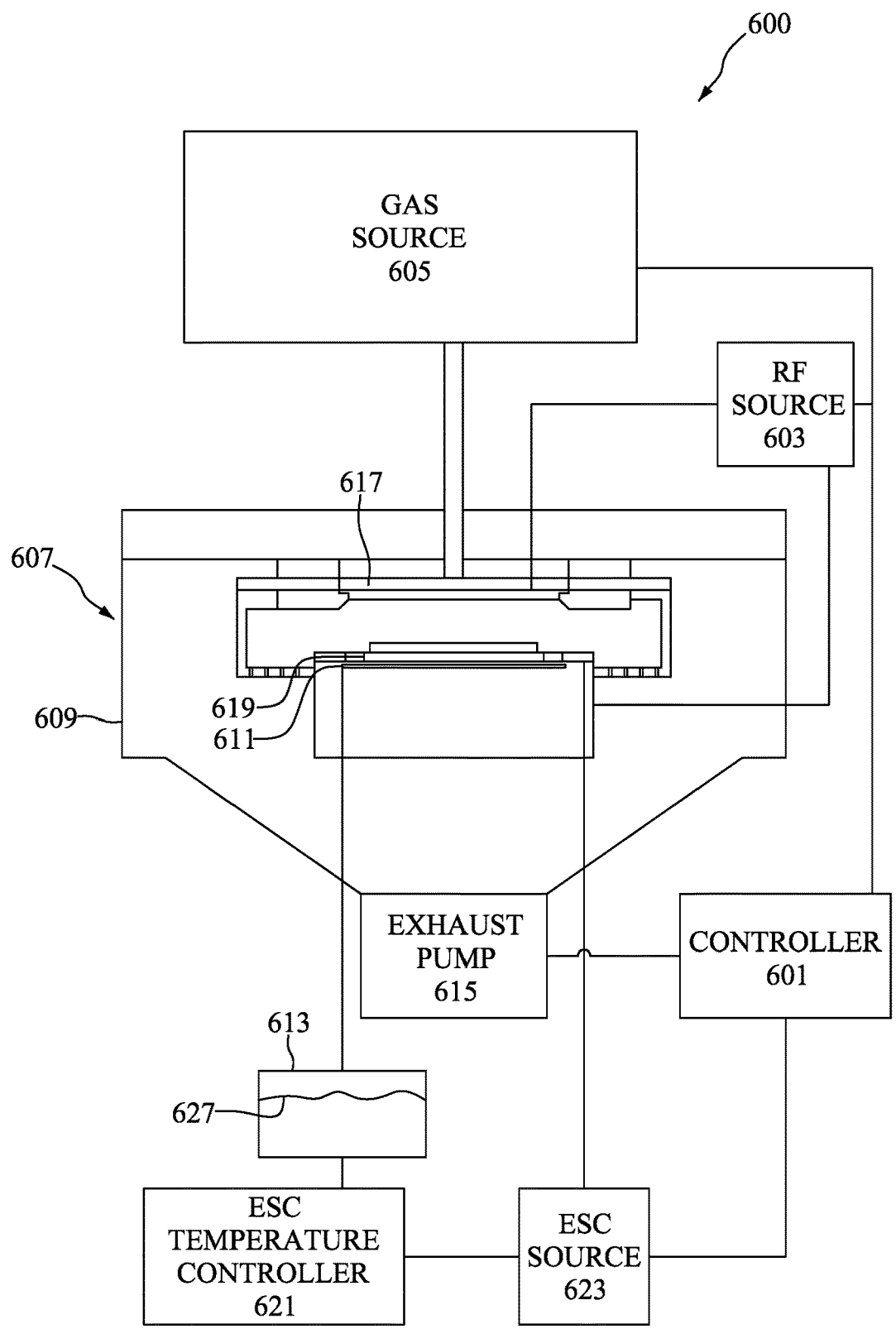
FIG. 14 illustrates, in a schematic diagram, an etch reactor used in some etch processes for fabricating the semiconductor device in accordance with one embodiment of the present disclosure.

FIG. 14 is a schematic diagram of an etch reactor 600 that may be used in the dense area etch process, the first loose area etch process, the second loose area etch process, and the stack etch process. In some embodiments, the etch reactor 600 includes a gas distribution plate 617 providing a gas inlet and an electrostatic chuck (ESC) 619, within an etch chamber 607, enclosed by a chamber wall 609. Within the etch chamber 609, the intermediate semiconductor device to be processed may be positioned over the ESC 619. The ESC 619 may provide a bias from the ESC source 623. An etch gas source 605 may be connected to the etch chamber 607 through the gas distribution plate 617. An ESC temperature controller 621 is connected to a chiller 613, which chills a coolant 627.

In some embodiments, the chiller 613 provides the coolant 627 to channels 611 in or near the ESC 619. A RF source 603 provides RF power to a lower electrode and/or an upper electrode, which are the ESC 619 and the gas distribution plate 617, respectively. In some embodiments, 400 kHz, 60 MHz, and optionally, 2 MHz, 27 MHz power sources make up the RF source 603 and the ESC source 623. In some embodiments, the upper electrode is grounded. In some embodiments, one generator is provided for each frequency. In some embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 601 may be controllably connected to the RF source 603, the ESC source 623, an exhaust pump 615, and the etch gas source 605. The process chamber can be a CCP (capacitively coupled plasma) reactor or an ICP (inductively coupled plasma) reactor.

One aspect of the present disclosure provides a semiconductor device including a substrate including a dense pattern area and a loose pattern area positioned adjacent to the dense pattern area; a plurality of dense conductive layers positioned on the dense pattern area of the substrate; and a plurality of loose conductive layers positioned on the loose pattern area of the substrate. A distance between an adjacent pair of the plurality of dense conductive layers is less than a distance between an adjacent pair of the plurality of loose conductive layers.

Another aspect of the present disclosure provides a method for fabricating a semiconductor device including providing a substrate including a dense pattern area and a loose pattern area, and sequentially forming a conductive stack and a first hard mask layer on the dense pattern area and the loose pattern area; patterning the first hard mask layer to form a plurality of dense patterning layers above the dense pattern area; forming a second hard mask layer covering the first hard mask layer and the plurality of dense patterning layers; patterning the second hard mask layer to form a plurality of loose capping layers above the loose pattern area; patterning the first hard mask layer above the loose pattern area using the plurality of loose capping layers as masks to form a plurality of loose patterning layers above the loose pattern area, and removing the second hard mask layer and the plurality of loose capping layers; and patterning the conductive stack using the plurality of dense patterning layers and the plurality of loose patterning layers as masks to form a plurality of dense conductive layers above the dense pattern area and a plurality of loose conductive layers above the loose pattern area. A distance between an adjacent pair of the plurality of dense conductive layers is less than a distance between an adjacent pair of the plurality of loose conductive layers.

Due to the design of the semiconductor device of the present disclosure, the plurality of dense conductive layers 301 and the plurality of loose conductive layers 303 with different element densities may be easily integrated in the semiconductor device 1A by employing the first hard mask layer 401 and the second hard mask layer 403. Therefore, the complexity of fabricating the semiconductor device 1A may be reduced. Accordingly, the yield of fabricating the semiconductor device 1A may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate comprising a dense pattern area and a loose pattern area, and sequentially forming a conductive stack and a first hard mask layer on the dense pattern area and the loose pattern area;
    patterning the first hard mask layer to form a plurality of dense patterning layers above the dense pattern area;
    forming a second hard mask layer covering the first hard mask layer and the plurality of dense patterning layers;
    patterning the second hard mask layer to form a plurality of loose capping layers above the loose pattern area;
    patterning the first hard mask layer above the loose pattern area using the plurality of loose capping layers as masks to form a plurality of loose patterning layers above the loose pattern area, and removing the second hard mask layer and the plurality of loose capping layers; and
    patterning the conductive stack using the plurality of dense patterning layers and the plurality of loose patterning layers as masks to form a plurality of dense conductive layers above the dense pattern area and a plurality of loose conductive layers above the loose pattern area;
    wherein a distance between an adjacent pair of the plurality of dense conductive layers is less than a distance between an adjacent pair of the plurality of loose conductive layers.

2. The method for fabricating the semiconductor device of claim 1, wherein the dense pattern area and the loose pattern area are adjacent to each other.

3. The method for fabricating the semiconductor device of claim 2, wherein an element density of the plurality of dense conductive layers is greater than an element density of the plurality of loose conductive layers.

4. The method for fabricating the semiconductor device of claim 3, wherein the first hard mask layer comprises silicon nitride.

5. The method for fabricating the semiconductor device of claim 4, wherein patterning the first hard mask layer to form the plurality of dense patterning layers above the dense pattern area comprises:

forming a first mask layer on the first hard mask layer, wherein the first mask layer completely covers the loose pattern area and partially covers the dense pattern area; and performing a dense area etch process using the first mask layer as a mask to form the plurality of dense patterning layers above the dense pattern area.

6. The method for fabricating the semiconductor device of claim 5, wherein patterning the second hard mask layer to form the plurality of loose capping layers above the loose pattern area comprises:

forming a second mask layer on the second hard mask layer, wherein the second mask layer completely covers the dense pattern area and partially covers the loose pattern area; and performing a first loose area etch process using the second mask layer as a mask to form the plurality of loose capping layers above the loose pattern area.

7. The method for fabricating the semiconductor device of claim 6, wherein etching gases of the dense area etch process comprise boron trichloride and chlorine.

8. The method for fabricating the semiconductor device of claim 7, wherein etching gases of the first loose area etch process comprise boron trichloride and chlorine.

9. The method for fabricating the semiconductor device of claim 8, wherein a ratio of boron trichloride to chlorine of the dense area etch process is greater than a ratio of boron trichloride to chlorine of the first loose area etch process.

10. The method for fabricating the semiconductor device of claim 9, wherein a power ratio of the dense area etch process is less than a power ratio of the first loose area etch process.

11. The method for fabricating the semiconductor device of claim 10, wherein the second hard mask layer comprises a material different from the first hard mask layer.

12. The method for fabricating the semiconductor device of claim 11, wherein the second hard mask layer comprises a carbon film, a dielectric material, or an anti-reflection coating.

13. The method for fabricating the semiconductor device of claim 6, wherein the conductive stack comprises a bottom conductive layer, a middle conductive layer, and a top conductive layer.

14. The method for fabricating the semiconductor device of claim 13, wherein the bottom conductive layer comprises titanium.

15. The method for fabricating the semiconductor device of claim 14, wherein the middle conductive layer comprises aluminum copper alloy.

16. The method for fabricating the semiconductor device of claim 15, wherein the top conductive layer comprises a titanium/titanium nitride bilayer.

17. The method for fabricating the semiconductor device of claim 16, wherein chemical etchings are greater than physical etchings during the dense area etch process.

18. The method for fabricating the semiconductor device of claim 16, wherein chemical etchings are less than physical etchings during the first loose area etch process.

* * * * *